US012422116B2

United States Patent
Graff et al.

(10) Patent No.: US 12,422,116 B2
(45) Date of Patent: Sep. 23, 2025

(54) HAZARDOUS AREA LIGHTING WITH EMERGENCY POWER BACK UP AND WIRELESS COMMUNICATIONS

(71) Applicant: APPLETON GRP LLC, Rosemont, IL (US)

(72) Inventors: Timothy E. Graff, Arlington Heights, IL (US); Ravindra Viraj Gurjar, Pune (IN)

(73) Assignee: APPLETON GRP LLC, Rosemont, IL (US)

(*) Notice: Subject to any disclaimer, the term of this patent is extended or adjusted under 35 U.S.C. 154(b) by 111 days.

(21) Appl. No.: 18/286,500

(22) PCT Filed: Jun. 6, 2022

(86) PCT No.: PCT/US2022/032327
§ 371 (c)(1),
(2) Date: Oct. 11, 2023

(87) PCT Pub. No.: WO2022/260990
PCT Pub. Date: Dec. 15, 2022

(65) Prior Publication Data
US 2024/0191850 A1 Jun. 13, 2024

(30) Foreign Application Priority Data
Jun. 8, 2021 (IN) .............................. 202121025528

(51) Int. Cl.
*F21S 9/02* (2006.01)
*G01R 31/392* (2019.01)
(52) U.S. Cl.
CPC ............ *F21S 9/024* (2013.01); *G01R 31/392* (2019.01)
(58) Field of Classification Search
CPC .............................. F21S 9/024; G01R 31/392
See application file for complete search history.

(56) References Cited

U.S. PATENT DOCUMENTS 9,967,955 B2    5/2018  Siefer et al.
10,416,243 B2 *  9/2019  Nelson ................... G01R 31/44
(Continued)

FOREIGN PATENT DOCUMENTS

CA    2559137 C  *  8/2020  ............. G06Q 30/04
CN    109479356 A     3/2019
(Continued)

OTHER PUBLICATIONS

First Examination Report for India Application No. 202121025528, dated Jan. 23, 2023.
(Continued)

*Primary Examiner* — Adam D Houston
(74) *Attorney, Agent, or Firm* — MARSHALL, GERSTEIN & BORUN LLP (57) ABSTRACT

Systems and methods of monitoring the health of an emergency power source for a luminaire node that is a node of a wireless mesh network utilized by a process control system include: utilizing, by the luminaire node, mains power to (i) route process control messages utilized by the process control system via the wireless network to thereby control an industrial process, and (ii) energize an illumination source of the luminaire node and/or maintain communications with another luminaire; storing, by the luminaire node, energy in an energy storage device configured to perform these functions during a loss of mains power; monitoring, by the luminaire node, the energy storage device to determine a health status associated with the energy storage device; and sending, by the luminaire node, an indication of the health status associated with the energy storage device via the wireless mesh network utilized by the process control system.

31 Claims, 4 Drawing Sheets

(56) References Cited

U.S. PATENT DOCUMENTS

| | | | |
|---|---|---|---|
| 10,652,972 B1* | 5/2020 | Norton | H05B 47/105 |
| 11,202,350 B2* | 12/2021 | Dolan | H05B 47/115 |
| 11,601,010 B2* | 3/2023 | Zaveruha | H02J 13/00026 |
| 2010/0327766 A1* | 12/2010 | Recker | H04L 7/0004 |
| | | | 362/20 |
| 2013/0127362 A1* | 5/2013 | Trainor | H02J 9/065 |
| | | | 324/414 |
| 2020/0329341 A1 | 10/2020 | Kuber et al. | |
| 2020/0403442 A1* | 12/2020 | Qui | H02M 7/5395 |
| 2021/0076470 A1 | 3/2021 | Graff et al. | |
| 2023/0198287 A1* | 6/2023 | Zaveruha | H02J 13/00026 |
| | | | 315/86 |
| 2024/0295434 A1* | 9/2024 | Chandarana | G01R 19/00 |

FOREIGN PATENT DOCUMENTS

| | | | |
|---|---|---|---|
| EP | 4304303 A1 * | 1/2024 | H05B 47/105 |
| EP | 4311067 A1 * | 1/2024 | H02J 7/005 |
| GB | 2 534 901 A | 8/2016 | |
| IN | 202047008157 A | 2/2020 | |
| WO | WO-2022220879 A1 * | 10/2022 | G05B 19/0425 |
| WO | WO-2024095034 A1 * | 5/2024 | |
| WO | WO-2024199916 A1 * | 10/2024 | H05B 47/11 |
| WO | WO-2025087875 A1 * | 5/2025 | |

OTHER PUBLICATIONS

International Search Report and Written Opinion for Application No. PCT/US2022/032327, dated Sep. 27, 2022.

\* cited by examiner

HAZARDOUS AREA LIGHTING WITH EMERGENCY POWER BACK UP AND WIRELESS COMMUNICATIONS

CROSS-REFERENCE TO RELATED APPLICATIONS

This application is a U.S. national stage application, filed under 35 U.S.C. § 371, of International Patent Application No. PCT/US22/32327, filed Jun. 6, 2022, the disclosure of which is incorporated by reference herein in its entirety.

FIELD OF THE DISCLOSURE

This disclosure relates to monitoring the health of backup power sources for luminaires in industrial environments.

BACKGROUND

The background description provided within this document is for the purpose of generally presenting the context of the disclosure. Work of the presently named inventors, to the extent described in this background section, as well as aspects of the description that may not otherwise qualify as prior art at the time of filing, are neither expressly nor impliedly admitted as prior art against the present disclosure.

Luminaires, lighting units, and light fixtures may provide general, ambient light, task or focused light, and/or emergency lighting within industrial environments such as industrial process plants, manufacturing facilities, oil refineries, power-generating systems, mines, warehouses, buildings, and the like. Some of these industrial environments may be hazardous environments and, accordingly, luminaires, lighting units, and light fixtures operating therein are required to be intrinsically safe and/or explosion proof, e.g., to prevent ignition and/or explosion of hazardous atmospheric mixtures such as flammable gases and/or dust, to protect electronics within the luminaire from being compromised or damaged, to contain any explosion that may occur, etc. Generally speaking, intrinsically safe and/or explosion proof luminaires, lighting units, and light fixtures are designed to limit undesirable and/or dangerous effects of thermal and/or electrical energy generated during both their normal use and maintenance, as well as during fault conditions.

Known luminaires, lighting units, and light fixtures in hazardous and/or in non-hazardous industrial environments may include or be attached to one or more sensors which sense or measure conditions in the environment in which the luminaires, lighting units, and light fixtures are located, such as ambient light, temperature, humidity, etc. More recently, "smart" luminaires, lighting units, and light fixtures have been designed to use computing functionality and lighting network connectivity to provide more sophisticated features, such as connected control of groups of luminaires of a lighting network, daylight harvesting (i.e., adjusting intensity by dimming or brightening based on the intensity of ambient light), and advanced motion detection (i.e., switching lights on and off based on the predicted motion of an individual through a facility). Further, within industrial environments, some smart luminaires, lighting units, and light fixtures may cooperate with process control systems to route process control messages on behalf of the process control system between various process control devices, components, and nodes, thereby leveraging the luminaires and the connected lighting network to deliver process control messages within an industrial environment.

For example, some luminaires utilize a wireless communication interface to communicate data, driving or control commands, and/or status updates as needed to provide smart lighting features and/or to route process control messages. In some arrangements, luminaires send and receive wireless transmissions via suitable wireless communication protocols such as Bluetooth® or other short-range protocol, Wi-Fi, Wireless Highway Addressable Remote Transducer Protocol (WirelessHART®), or other wireless communication protocols. In other arrangements, the luminaire sends, via a wireless communication network, wireless transmissions to a host computer or back-end system for processing and forwarding via one or more wireless communication networks.

SUMMARY

Luminaires may be installed in various indoor and/or outdoor locations of an industrial environment to provide ambient, directed, task, and/or emergency lighting. The luminaires may be powered primarily via mains power, such as alternating-current (AC) electric power delivered to the industrial environment via an electrical power grid infrastructure or other outside electrical power source. Wiring which delivers power to the various luminaires is typically enclosed and shielded from the harsh industrial environment, e.g., behind a wall or ceiling, within conduit or other physical shields, etc. Each luminaire may include a battery or other local power storage device, which the luminaire may utilize in the event of mains power loss. Luminaires may be stand-alone luminaires, or may be communicatively connected via a connected lighting network to perform and coordinate the execution of smart lighting features within the industrial environment. For example, the luminaires may communicate with other luminaires and other nodes (such as back-end servers, data historians, user interface devices, etc.) via a wireless lighting network to coordinate illumination functions within the environment, transmit status and/or other administrative messages related to lighting activities, etc.

Many industrial environments serviced by the luminaires utilize one or more wired and wireless process control networks (also referred to interchangeably herein as "process control communication networks," "process control data networks," "industrial networks," "industrial communication networks," or "industrial data networks") to send and receive process control messages (e.g., data, commands, statuses, and the like) to and from various components, devices (e.g., including field devices), and/or nodes to thereby control an industrial process. For example, a process control system (PCS) within an industrial environment may utilize the one or more process control wireless networks, which may be mesh wireless networks, to transmit and receive process control and other related messages. Components, devices (e.g., including field devices), and/or nodes within the industrial environment may transmit messages via the one or more wireless networks, typically by utilizing a standardized protocol that is particularly designed for industrial control applications. That is, the industrial wireless protocol utilized by an industrial wireless communication network enables the timing and delivery of process control messages to and from receiving and sending nodes in industrial environments so that nodes may operate on the message contents within specified time intervals to control respective portions of the process. Specifically, the delivery of process control messages via the wireless network is scheduled and controlled across the network so that the industrial process does not become unstable and the wireless network does not become overloaded and thereby cause errors, faults, uncontrolled behaviors, and in some cases, dangerous consequences such as explosions, leaks, fires, and the like, which may lead to loss of equipment and more importantly, loss of human life. An example of such a commonly utilized wireless industrial protocol is WirelessHART; however, any suitable wireless protocol which supports the scheduling and time-synchronization of the delivery and reception of process control messages between nodes of the network to control an industrial process and thereby manage risk within the industrial environment may be utilized. Generally speaking, a wireless network manager generates or creates a network schedule for the industrial wireless communication network, and the network manager provides respective portions of the schedule to nodes of the wireless network so that each node is configured to access the wireless network at respective scheduled or designated times or time slots to send and/or receive process control related messages, and so that communications between nodes of the industrial wireless communications network are delivered in a coordinated and controlled manner across the network.

In some situations, luminaires may be included in the process control wireless network to serve as additional routing and/or connection points or nodes within the wireless network. For example, luminaires, at least due to their respective, easily accessible locations throughout the industrial environment, may be configured to serve as routing or intermediate nodes within the process control wireless network. In some situations, a luminaire may serve as a bridge, hub, local gateway, or connecting node between one or more process control devices or components (e.g., sensors, actuators, valves, and/or other types of field devices) and the remainder of the wireless network (e.g., controllers, gateways, servers, user devices, etc.) so that the one or more process control devices are communicatively connected to the remainder of the process control wireless network via the luminaire. In some situations, at least due to their respective connections to mains power, luminaires may serve as a local sources of power (e.g., mains power or back-up power) for one or more process control devices or components.

Presently, when a luminaire is serving as an intermediate, routing, bridge, or connecting node of a process control wireless network, though, loss of mains power to the luminaire causes a disconnect in the overall process control wireless network, as the luminaire node is no longer available. Further, if the luminaire node is serving as a bridge or connecting node for other process control devices to communicate via the wireless network, the other process control devices are cut off from communicating with the process control system due to the unavailability of the luminaire node. Industrial mesh wireless networks and the protocol utilized by such networks (e.g., WirelessHART) are able to automatically recover from these and other types of node failures by re-routing packets and/or reconfiguring or adjusting the overall network schedule, e.g., per direction of the network manager. However, such automatic re-routing, reconfiguring, and adjusting of routing and scheduling typically takes a significant amount of time, during which process control network functionality is compromised. For example, a wireless process control network having 50 nodes may take between 12 and 24 hours to reconfigure itself and stabilize, even when the duration of the loss of mains power at the luminaire is only a few minutes. Indeed, wireless process control networks which have greater numbers of nodes (e.g., hundreds or thousands of nodes) may take days to reschedule and reorganize. Further, not only are the process control devices serviced by the luminaire routing node unable to communicate with the remainder of the process control system, but while the network is reorganizing, other process control messages may be sub-optimally routed through the process control system network, thereby causing delays, increasing network traffic, and decreasing network bandwidth, which compromises the performance and fidelity of the process control system and may increase risk due to delayed and/or lost messages.

The systems, methods, luminaires, and techniques described herein provide increased network reliability using luminaires, and in particular, when partial or entire loss of mains power occurs at the luminaires. Generally speaking, a luminaire configured in accordance with the systems, methods, and techniques described herein serves as a node of a wireless process control system, and as such routes and optionally transmits and/or receive process control messages to and from process control devices via a wireless mesh network to thereby control an industrial process. That is, the luminaire is included the wireless process control network of the industrial plant or environment. As such, within this disclosure, such luminaires are generally referred to as a "luminaire node," as the luminaires are nodes of process control networks as well as an illumination source. The luminaire node may be one of a plurality of luminaires which are communicatively connected via wired and/or wireless lighting network, where the wired and/or wireless lighting network is utilized to coordinate and control lighting and other characteristics of the plurality of luminaires. One or more other luminaires within the lighting network may also be luminaire nodes, and one or more other luminaires may not be luminaire nodes. Alternatively, the luminaire node may be a stand-alone luminaire which is not communicatively connected to any lighting network even though the luminaire node is communicatively connected to the process control network.

At any rate, upon the luminaire node detecting a partial or total loss of mains power, the luminaire node apportions at least a portion of the remaining, available power stored in a battery or other energy storage device to support and maintain the continued routing of process control messages via the process control network. Similarly, the luminaire allocates some or none of the remaining stored energy to support and maintain lighting functionalities, activities, and/or subset thereof. As such, the luminaire node maintains the routing of process control messages during and after loss of mains power at the luminaire node, thereby mitigating, lessening, and in some cases eliminating any inefficiencies or errors in the process control network due to the loss of mains power at the luminaire. Advantageously, with the systems, methods, luminaire nodes, and techniques described herein, hours and days of network inefficiencies and resulting undesirable effects on the industrial process (e.g., due to the time required for the wireless process control network to reschedule and re-organize itself) may be partially or entirely eliminated, and the overall robustness and reliability of the wireless process control network may be increased.

In particular, the luminaire node may periodically (e.g., on a daily, weekly, monthly, etc. basis, or during periods of plant maintenance or downtime) or continuously monitor the health of the battery or other energy storage device to determine whether the performance of the battery or other energy storage device has deteriorated and send an indication of the health of the battery or other energy storage device to operators or other users via the network. This may include monitoring the voltage of the battery or other energy storage device to predict a length of time for which the battery or other energy storage will be able to provide power to support and maintain the continued routing of process control messages via the process control network and/or to maintain lighting functionalities or activities in the event of a partial or total loss of mains power. In some examples, the luminaire node may trigger a self-test routine to test the health of the battery or other energy storage device based on a command from a user, and provide an indication of the battery or other energy storage device's performance to operators or other users via the network. Beneficially, with the systems, methods, luminaire nodes, and techniques described herein, operators or other users can initiate replacement of the battery or other energy storage device based on the measured health or remaining life of the battery or other energy storage device as needed in order to prevent total power outages. Moreover, in some examples, individual or group level luminaire dimming functions may be implemented based on the measured health or remaining life of the battery or other energy storage device in order to conserve the power of the battery or other energy storage device. Additionally, in some examples, the routing or scheduling of the process control messages may be adjusted based on the measured health or remaining life of the battery or other energy storage device in order to conserve the power of the battery or other energy storage device.

In an embodiment, a method of monitoring the health of an emergency power source for a luminaire node that is a node of a wireless mesh network utilized by a process control system includes: utilizing, by a luminaire node that is a node of a wireless network utilized by a process control system, mains power to (i) route process control messages utilized by the process control system via the wireless network to thereby control an industrial process, and (ii) at least one of energize an illumination source of the luminaire node or maintain communications with another luminaire; storing, by the luminaire node, energy in an energy storage device configured to, during a loss of mains power, provide power to (i) route process control messages utilized by the process control system via the wireless network to thereby control the industrial process, and (ii) at least one of energize the illumination source of the luminaire node or maintain communications with another luminaire; monitoring, by the luminaire node, the energy storage device to determine a health status associated with the energy storage device; and sending, by the luminaire node, via the wireless network, an indication of the health status associated with the energy storage device.

In an embodiment, a luminaire node included in a plurality of nodes which utilize mains power to transmit and receive process control messages via a wireless network to thereby control an industrial process includes an illumination source energized by mains power; and an energy storage device configured to, during a loss of mains power, provide power to energize the illumination source, and to transmit and receive the process control messages via the wireless network to thereby control the industrial process, the luminaire node configured to: monitor the energy storage device to determine an indication of a health status associated with the energy storage device; and send, via the wireless network, messages including the indication of the health status associated with the energy storage device.

In an embodiment, a method of testing an emergency power source for a luminaire node that is a node of a wireless network utilized by a process control system includes: utilizing, by a luminaire node that is a node of a wireless network utilized by a process control system, mains power to (i) route process control messages utilized by the process control system via the wireless network to thereby control an industrial process, and (ii) at least one of energize an illumination source of the luminaire node or maintain communications with another luminaire; storing, by the luminaire node, energy in an energy storage device configured to, during a loss of mains power, provide power to (i) route process control messages utilized by the process control system via the wireless network to thereby control the industrial process, and (ii) at least one of energize the illumination source of the luminaire node or maintain communications with another luminaire; initiating, by the luminaire node, a self-testing routine to test the energy storage device of the luminaire node; and transmitting, from the luminaire node to an end-user device, a set of results from the self-testing routine.

DETAILED DESCRIPTION

Figure 1:
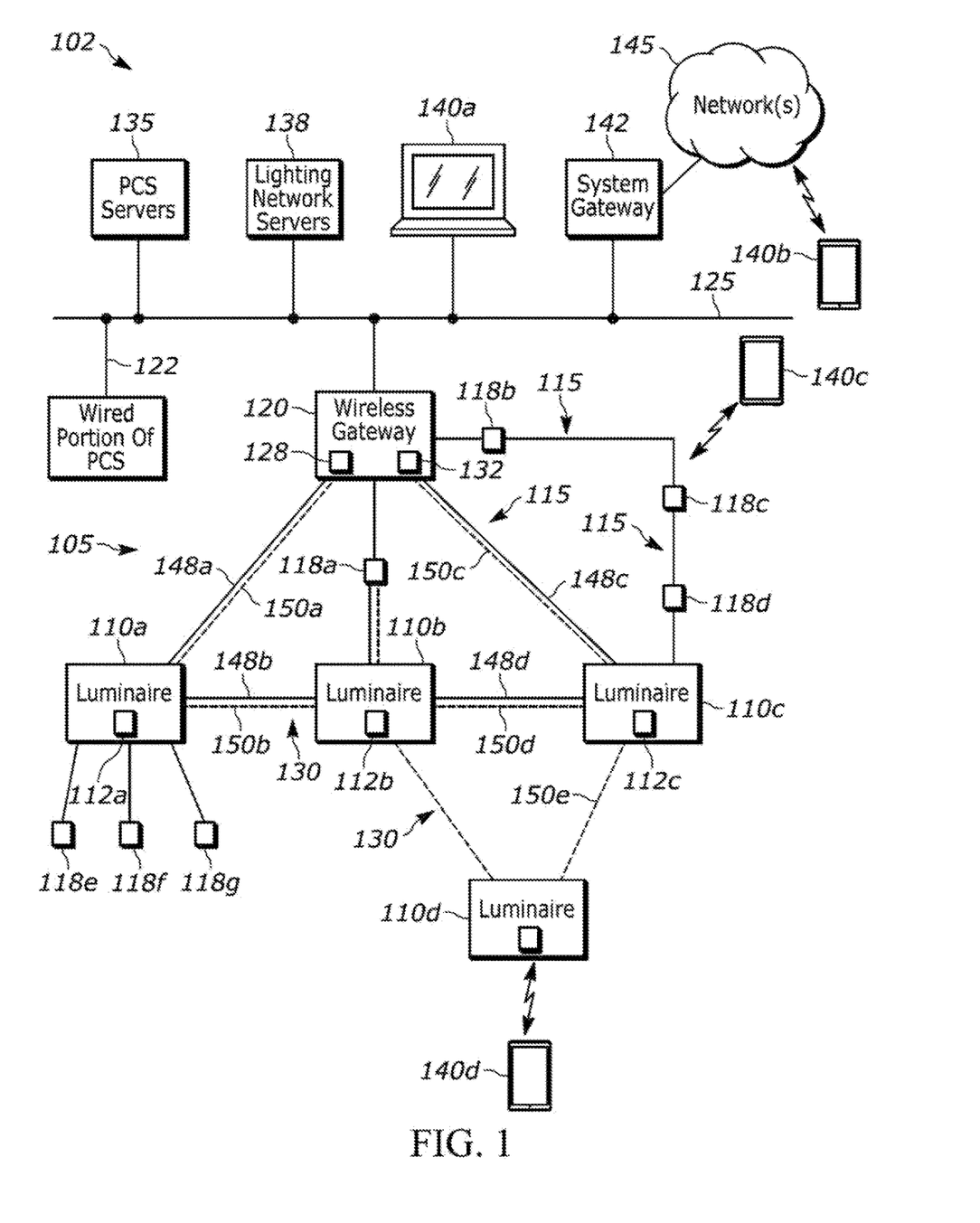
FIG. 1 illustrates an example industrial environment in which process control wireless network reliability may be maintained by utilizing the systems, methods, luminaire nodes, and/or techniques of the present disclosure.

FIG. 1 illustrates an example industrial environment 100 in which embodiments of the systems, methods, luminaires, and techniques described herein may be implemented. In some situations, the example industrial environment may be disposed within a hazardous environment 100, such as an industrial process plant, a manufacturing facility, an oil refinery, a power-generating system, a mine, etc. in which components (such as luminaires, communication networks, process control devices, etc.) As interchangeably utilized herein, the terms "luminaire," lighting unit", and "light fixture generally refer to an electrically powered component which operate to supply general or ambient light and/or task or focused light in the portion of the electromagnetic spectrum that is visible to the human eye, e.g., from about 380 to 740 nanometers. As shown in FIG. 1, the industrial environment 100 includes a back-end environment 102 and a field environment 105. In some industrial environments 100, such as those of an industrial process plant, a manufacturing facility, an oil refinery, a power-generating system, a mine, etc., the field environment 105 is a hazardous environment. Accordingly components disposed within the hazardous field environment 105 (e.g., luminaires, communication network components, process control devices, etc.) must comply with all standards and/or regulatory rules that are applicable to the particular hazardous environment in which they are disposed to limit undesirable and/or dangerous effects of thermal and/or electrical energy generated during both their normal use and maintenance, as well as during fault conditions.

As shown in FIG. 1, three luminaires 110a, 110b, 112c which are configured according to one or more of the techniques described herein are disposed within the field environment 105. That is, each of the luminaire nodes 110a, 110b, 110c is a luminaire node. For example, each of the luminaire nodes 110a, 110b, 110c is respectively configured 112a, 112b, 112c (e.g., via hardware and/or computer-executable instructions and configurations stored on memories) to provide illumination, support maintaining process control or industrial wireless network reliability and/or connectivity, to perform other actions and techniques related thereto as described herein. In FIG. 1, each of the luminaire nodes 110a, 110b, 110c is a respective node of a wireless process control network 115 (link of which are denoted in FIG. 1 by the solid lines), where the wireless process control network 115 also includes other wireless nodes 118a-118g and a wireless gateway 120. In an embodiment, the wireless process control network 115 may be a wireless mesh network which utilizes a time-synchronized wireless protocol. The wireless nodes 118a-118g may be, for example, wireless field devices, wireless adaptors servicing respective wired field devices, routers, and/or other process control devices of a process control system (PCS). As illustrated in FIG. 1, process control devices 118e-118g are communicatively connected to the rest of the wireless network 115 via the luminaire node 110a, so that any process control related messages are routed to and from devices 118e-118g via the luminaire node 110a. Process control device 118d is communicatively connected to the wireless network 115 via both process control device 118c and via luminaire node 110c.

The wireless gateway 120 communicatively connects the wireless process control network 115 with the back-end environment 102 and/or other wired portions 122 of the process control system via a data highway or backbone 125, which may be an Ethernet, broadband fiber optic, or any suitable type or types of wired backbone(s). The wired portions 122 of the process control system may be disposed at least in part in the field environment 105 of the industrial environment 100, and may include, for example, controllers, I/O devices, marshalling equipment, wired field devices, and/or other types of wired process control devices. As such, each of the luminaire nodes 110a, 110b, 110c is included in the wireless network 115 of a process control system which includes the wireless portion 115 and a wired portion 122 disposed in the field environment 105, where the process control system operates to control an industrial process within the industrial environment 100. Thus, each luminaire 110a, 110b, 110c may be configured 112a, 112b, 112c to support maintaining the reliability of the wireless process control network 115.

As mentioned above, the wireless process control network 115 typically utilizes a time-synchronized wireless protocol such as WirelessHART or other suitable wireless protocol to deliver control, data, and other types of messages between wireless nodes. Accordingly, the network 115 includes a wireless network manager 128 which, as denoted in FIG. 1, is included in the wireless gateway 120. (In other embodiments, though, the wireless network manager 128 may be a separate node of the network 112 and not integral with the wireless gateway 120.) As previously discussed, the wireless network manager 128 performs administrative and coordination tasks related to the process control wireless network 115, such as generating, reorganizing, updating, and administrating a network schedule, distributing respective portions of the network schedule to respective nodes, managing time-synchronization among wireless nodes, delivering messages between the wireless portion 115, the wired portion 122, and/or the back-end environment 102 of the process control network, and the like.

In FIG. 1, in addition to being nodes of the wireless process control network 115 of the process control system, each of the luminaire nodes 110a, 110b, 110c is also a respective node of a lighting network 130 (links of which are denoted in FIG. 1 by the dashed lines), where the lighting network 130 may include one or more other luminaires 110d which are not part of the wireless network 115 of the process control system. That is, the luminaire nodes 110a, 110b, 110c may simultaneously be both nodes of the wireless process control network 115 and nodes of the lighting network 130, while the luminaire node 110d is not a node of the wireless process control network 115 but is a node of the lighting network 130. At least a portion or an entirety of the lighting network 130 may be a wireless mesh network, and in some embodiments, at least a portion of the wireless mesh network utilized by the lighting network 130 and at least a portion of the wireless mesh network utilized by the wireless process control network 115 may intersect and include the same links, nodes, etc. In some embodiments, the lighting network 130 (or wireless portion thereof) may utilize a time-synchronized wireless protocol such as WirelessHART or other suitable wireless protocol to deliver lighting commands, instructions, and/or administrative information between lighting network nodes. In some configurations, the time-synchronized wireless protocol utilized by the lighting network 130 and the time-synchronized wireless protocol utilized by the wireless process control network 115 is the same protocol. In these configurations, both the wireless lighting network 130 and the wireless process control network 115 may be under the direction of the network manager 128, e.g., for scheduling, time synchronization, and other such purposes.

The luminaire nodes 110a, 110b, 110c and the luminaire 110d of the lighting network 130 operate to coordinate and control illumination within the industrial environment 100, as well as to perform other tasks related to providing illumination, e.g., by sending and receiving lighting control, data, and other types of messages via the lighting network 130. In embodiments, the lighting network 130 includes a lighting controller 132 which coordinates lighting/illumination activities of the lighting network 130 and administration thereof. In FIG. 1, the lighting controller 132 is illustrated 132 as being included in the wireless gateway 120; however, the lighting controller 132 may be included in any desired node of the lighting network 130, including a stand-alone in embodiments, and the lighting controller 132 typically is communicatively connected to the data highway 125 or another data highway. The lighting controller 132 may be in communicative connection with the network manager 128, and in some embodiments, the lighting controller 132 and the network manager 128 are an integral unit (not shown).

In the example industrial environment 100 of FIG. 1, the lighting network 130 is depicted as a wireless network which utilizes the time-synchronized protocol of the wireless network 115, and as such the luminaire nodes 110a, 110b, 110c and the luminaire 110d are communicatively connected with the back-end environment 102 via the wireless gateway 120 and the data backbone 125, e.g., via the same wireless gateway 120 and backbone 125 utilized by the wireless process control network 115. That is, at least a portion of the wireless process control network 115 and at least a portion of the lighting network 130 (e.g., nodes, links, gateway, etc.) intersect or are commonly utilized by both networks 115, 130 and are under the administrative networking purview of the network manager 128; however, this is just for ease of illustration and not for limitation purposes. For example, in other embodiments (not shown), the wireless process control network 115 and the lighting system network 115 may commonly utilize less or more components, and in still other embodiments (also not shown), the wireless lighting network 130 may be communicatively connected to the back-end environment 102 via its own, independent gateway and/or its own data backbone that are separate and different from the gateway 120 and the backbone 122, and may optionally may utilize its own network manager. Further, it is noted that although lighting network 130 is illustrated in FIG. 1 as being a wireless network, the lighting network 130 may be implemented by any number and/or combination of wired and/or wireless links and networking techniques, in embodiments.

The back-end environment 102 of the industrial environment 100 is protected from the harsh conditions of the field environment 105, and as such, various components of back-end may be safely disposed in the back-environment 102. For example, one or more back-end servers 135 of the process control system (PCS) may be disposed in the back-end environment 102, and may provide functionalities which support the real-time operations of the PCS such as configuration, data historian, analytics, reporting, etc. Additionally, one or more back-end servers 138 of the lighting network 130 may be disposed in the back-end environment, and may provide functionalities to support the coordinated illumination provided by the lighting network 130, such as configuration, control instructions, data historian, analytics, reporting, etc. It is noted that although the PCS back-end servers 135 and the lighting network back-end servers 138 are illustrated in FIG. 1 as being independent sets of servers, in some embodiments (not shown), at least a portion of the PCS back-end servers 135 and at least a portion of the lighting network servers 138 may be implemented as one or more integral servers. Further, in embodiments, at least a part of the PCS back-end servers 135 and/or at least a part of the lighting network servers 138 may be physically disposed in locations which are physically remote from the environment 100, such as at remote server banks, in a cloud computing system, etc.

The back-end environment 102 of the industrial environment 100 may also include one or more locally or remotely disposed user interface devices 140a-140d, which may include locally or remotely disposed computing devices, such as desktops, laptops, tablets, phones, smart devices, connected vehicle devices, and/or other types of Personal Electronic Devices (PEDs). For example, one or more user interface devices 140a utilized respectively by operators and/or by configuration engineers of the process control system and/or of the lighting network 130 may be locally connected in a wired manner to the data highway 125. One or more user interface devices 140b may be utilized respectively by operators and/or by configuration engineers of the process control system and/or of the lighting network 130 may be disposed remotely from the industrial environment site 100, and may be communicatively connected to the data highway 125 via a system gateway 142 and one or more public and/or private communications or data networks 145, for example. Additionally or alternatively, one or more user interface devices 140c, 140d may be utilized by personnel located within the field environment 105 of the industrial environment 100, where the devices 140c, 140d may be communicatively connected to respective process control and/or lighting systems directly via local means, e.g., via wireless network 115, a wireless portion of the lighting network 130, or other suitable wireless links and/or networks. For instance, one or more of the user interface devices 140c, 140d may be communicatively connected to the process control network 115 or nodes thereof and/or to the lighting network 130 or nodes thereof remotely via networking means, e.g., by utilizing a generic last-mile wireless local network (e.g., Wi-Fi, cellular, short-range wireless protocols, etc.) proximate to or included in the field environment 105, the one or more public and/or private networks 145, and the system gateway 142.

Further, as shown in FIG. 1, each user interface device 140a-140d may execute applications, thin clients, or other types of user interfaces, each of which services the process control system, the lighting system, or both systems. For example, the user interface device 140a which is physically disposed in the back-end environment 102 of the industrial environment 100 may include (and execute) one or more process control system-specific user interface applications and/or one or more lighting system-specific user interface applications. In another example, a remote user interface device 140b (e.g., which is utilized by remotely located personnel) may execute one or more applications, thin clients, etc. corresponding to one or more process control system user interfaces, one or more lighting system interfaces, or both. In still another example, user interface device 140c is configured to only service the process control system and not the lighting system, and thus executes process control user interfaces (e.g., which may communicate with the process control system via wireless network 115) and not lighting system user interfaces. User interface device 140d is configured to service only the lighting system and not the process control system, and thus executes lighting system user interfaces (e.g., which may communicate with the lighting system via the lighting network 130) and not process control system user interfaces.

Figure 2:
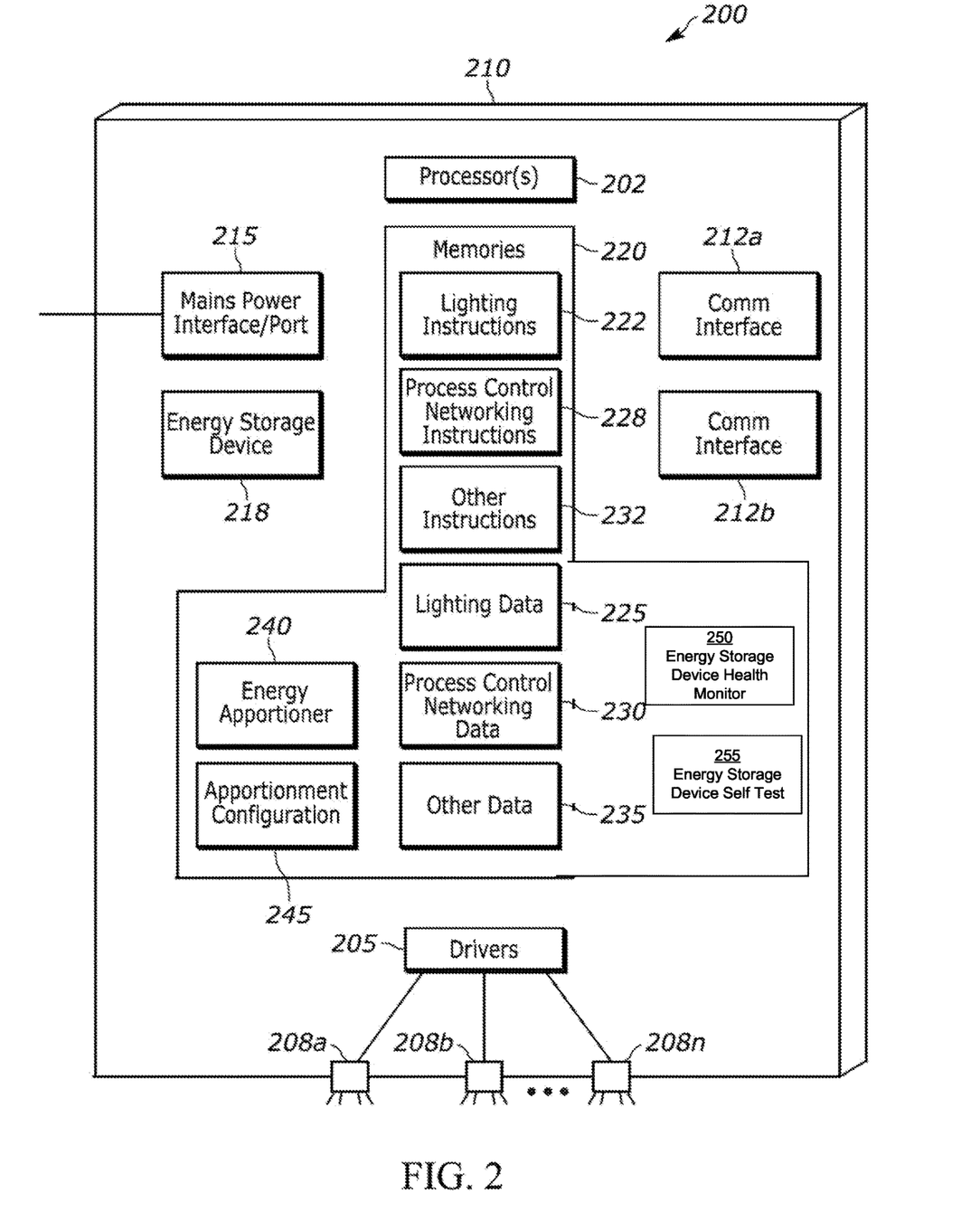
FIG. 2 is a block diagram of an example luminaire node which may be used in the exemplary industrial environment of FIG. 1.

FIG. 2 is a block diagram of an example luminaire node 200 which may be used in the exemplary industrial environment of FIG. 1. For example, one or more portions or the entirety of the luminaire node 200 may be included in the luminaire node 110a, 110b, and/or 110c of FIG. 1, or may be included in other luminaires which are communicatively connected via a lighting network. In another example, the luminaire node 200 may be a stand-alone luminaire 200 for lighting/illumination purposes, and thus is not communicatively connected to any other luminaires. The luminaire node 200 is described with simultaneous reference to FIG. 1; however, this is merely for clarity of illustration and not limitation purposes. For example, instances of the luminaire node 200 maybe utilized in environments other than the industrial environment 100, or the luminaire node 200 may be a stand-alone luminaire 200.

The luminaire node 200 includes one or more processors 202, one or more drivers 205 (e.g., for illumination or visible light sources), and one or more illumination or visible light sources 208a-208n that are enclosed in, surrounded by, and/or otherwise protected by an enclosure 210, which may be a hazardous environment enclosure. Additionally, the luminaire node 200 includes one or more communication interfaces 212a, 212b via which the luminaire node 200 may communicatively connect to a wireless process control network (such as the wireless network 115) and optionally to a lighting network (such as the lighting network 130), and thus may include respective digital signal processors (DSPs), transceivers, antennas, etc. For example, the one or more communication interfaces 212a, 212b may include one or more wireless communication interfaces via which the luminaire node 200 wirelessly communicates with the wireless process control network 115 (e.g., via WirelessHART or other suitable time-synchronized wireless protocol) and optionally with the lighting network (e.g., via the time-synchronized wireless protocol or some other suitable wireless protocol). In some embodiments, the one or more communication interfaces 212a, 212b may include one or more wired interfaces via which the luminaire node 200 communicates in a wired manner with other luminaires and components of the lighting network 130. In some embodiments, the one or more communication interfaces 212a, 212b may include a hybrid wired/wireless communication interface.

The luminaire node 200 includes a mains power interface or port 215 electrically connecting the luminaire node 200 to a source of mains power, which typically is a general-purpose alternating-current (AC) electric supply, such as provided by utility power, an electric grid, a generator, etc. For the most part, during normal operations, the luminaire node 200 may be powered via the mains power received via the mains power interface/port 215. The luminaire node 200 also includes an energy storage device 218 such as a battery, capacitor, or other suitable power storage device which may serve as a back-up source of power, and via which the luminaire node 200 may be powered during certain situations, such as when mains power is disconnected, intermittent, or otherwise not available. Typically, upon detecting that mains power is no longer available via the mains power interface 215, the luminaire node 200 may automatically switch to using the energy storage device 218 as its source of power, and upon detecting that mains power is restored, the luminaire node 200 may automatically return to utilizing mains power as its primary source of energy.

Generally speaking, for the purposes of providing illumination or visible lighting as well as to perform tasks related to illumination/lighting (such as administrative tasks, diagnostics, maintenance operations, etc.), the luminaire node 200 includes one or more memories 220 storing a set of computer-executable lighting instructions 222. The one or more processors 202 may execute the lighting instructions 222 to cause the luminaire node 200 to perform lighting-related tasks, such as instructing the one or more drivers 205 to energize or activate the one or more illumination sources 208a-208n, e.g., individually or independently, and/or as a set or group in a coordinated manner. For example, the executing lighting instructions 222 may instruct the one or more drivers 205 to energize, activate, de-energize, or deactivate the one or more illumination sources 208a-208n of the luminaire node 200 based on sensor signals or other detected conditions. If the luminaire node 200 is connected to the lighting network 130, the executing lighting instructions 222 may instruct the one or more drivers 205 to energize, activate, de-energize, or deactivate the one or more illumination sources 208a-208n of the luminaire node 200 based on driving commands which are transmitted by the lighting controller 132 of the lighting network 130 (not shown in FIG. 2) and received at the luminaire node 200 via the communication interfaces 212a, 212b and lighting network 130. In some connected lighting configurations, the one or more processors 202 may execute the lighting instructions 222 to send administrative messages to (and/or receive administrative messages from) the lighting controller 132 via the communication interfaces 212a, 212b and the lighting network 130, such as usage statistics, component status, and the like, to perform diagnostics, etc. Lighting data 225 which the luminaire node 200 utilizes (and in some cases, reads and/or writes) to perform lighting-related functions, activities, and tasks may be stored in the one or more memories 220 of the luminaire node 200. The lighting data 225 may store, for example, the portion of the network schedule (e.g., as generated by and received from the wireless network manager 128) which defines or directs the luminaire node's lighting-related communications, a configuration of the luminaire node 200 as a lighting node within the lighting network 130 or as a stand-alone luminaire 200, records of lighting events, data, diagnostic results, and/or statistics, and the like.

As the luminaire node 200 serves as a node of the wireless network 115 of the process control system, the luminaire node 200 further includes a set of process control networking instructions 228 stored on its one or more memories 220. The one or more processors 202 may execute the process control networking instructions 228 to cause the luminaire node 200 to perform process control networking tasks, such as routing process control messages to and from other wireless nodes in accordance with the time-synchronized schedule generated by the network manager 128 of the wireless network 115. For example, when the luminaire node 110a is configured as an instance of the luminaire node 200, the luminaire node may receive process control messages to be routed to process control devices 118g, 118f, and 118e, and may forward (via wireless network 115) such messages to/from their respective recipients 118g, 118f, 118e in accordance with the network schedule. In a similar manner, when the luminaire node 110c is configured as an instance of the luminaire node 200, the luminaire node 110c may receive process control messages from the process control device 118d, and may forward (via wireless network 115) such messages to their respective recipients in accordance with the network schedule. As such, the memories 220 of the luminaire node 220 store process control networking data 230 to support process control networking tasks performed by the luminaire node 200. For example, the process control networking data 230 may store the portion of the network schedule (e.g., as generated by and received from the wireless network manager 128) which defines or directs the luminaire node's process control message routing activities, a configuration of the luminaire node 200 as a wireless node within the wireless network 115, records of process control networking events, data, and/or statistics, and the like.

Of course, the memories 220 of the luminaire node 200 may store other instructions 232 and other data 235 in addition to those related to lighting and process control networking.

The luminaire node 200 provides increased reliability of the process control wireless network 115, and in particular, when partial or total loss of mains power occurs at the luminaire nodes. A partial loss of mains power may include, for example, situations in which mains power is received intermittently at the luminaire node 200. A total loss of mains power may include, for example, situations in which no mains power at all is received at the luminaire node 200.

Upon the luminaire node 200 detecting a partial or total loss of mains power at the mains power interface or port 215, the luminaire node 200 may apportion at least a portion of the remaining power stored in the energy storage device 218 to support and maintain the continued routing of process control messages via the process control network 115. Similarly, the luminaire node 200 may apportion some or none of the remaining energy stored in the energy storage device 218 to support and maintain lighting functionality, whether the luminaire node 200 is a standalone luminaire or is connected/networked to other luminaires. In situations in which the luminaire node 200 detects only a partial loss of mains power, the luminaire node 200 may apportion a remainder of the mains power to support and maintain the continued routing of process control messages, to support and maintain lighting functionality, and/or to perform other tasks at the luminaire node 200, such as charging the energy storage device 218.

At any rate, the luminaire node 200 maintains the routing of process control messages during and after loss of mains power at the luminaire node 200, thereby mitigating, lessening, and in some cases eliminating any inefficiencies or errors in the process control network 115 due to the loss of mains power at the luminaire node 200, and thereby maintaining the reliability and robustness of the process control network 115. As shown in FIG. 2, the luminaire node 200 may include an energy apportioner 240, where the energy apportioner 240 includes a set of computer-executable instructions stored on the one or more memories 220 and executable by the one or more processors 202 to cause the luminaire node 200 to take these apportioning and other mitigating actions when mains power to the luminaire node 200 is partially or totally lost. Generally speaking, and as is described in more detail elsewhere within this disclosure, the energy apportioner 240 apportions available energy stored in the energy storage device 218 towards supporting process control networking and/or towards supporting lighting, lighting networking and/or lighting administrative tasks when changes to the energy available for consumption by the luminaire node 200 occur, such as due partial or total loss of mains power, decreasing levels of energy stored in the energy storage device 218, resumption of mains power, etc. In an embodiment, the energy apportioner 240 utilizes an apportionment configuration 245 stored in the one or more memories 220 of the luminaire node 200 to determine a corresponding energy apportionment for different energy-related events, e.g., in a manner such as described elsewhere herein. In an embodiment, the energy apportioner 240 is responsive to instructions received from other components of the process control network 115, lighting network 130, and/or user interface devices 140a-140d, e.g., in a manner such as described elsewhere herein.

Figure 3:
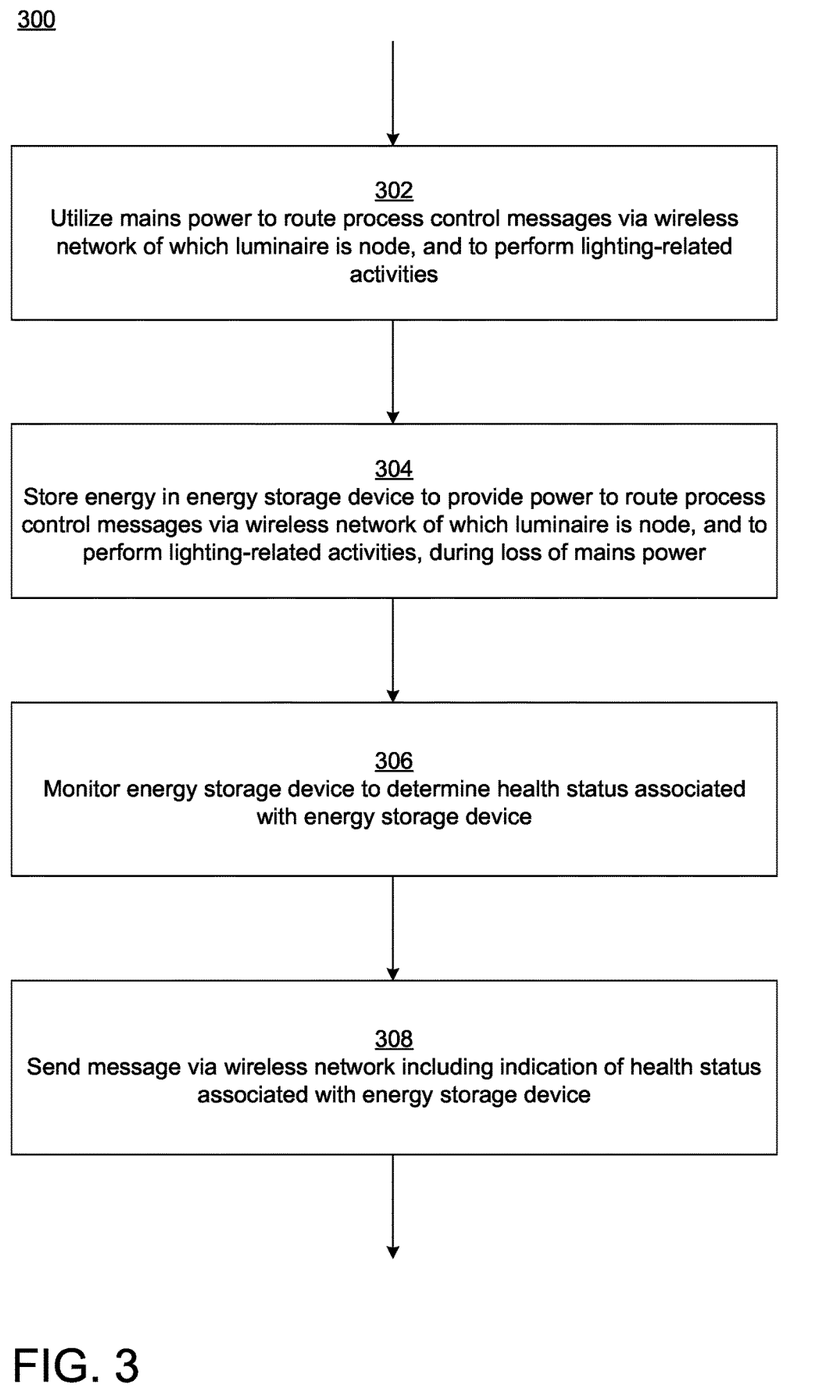
FIG. 3 is a flow diagram of an exemplary method of monitoring the health of an emergency power source for a luminaire node that is a node of a wireless mesh network utilized by a process control system.

Furthermore, as shown in FIG. 2, the luminaire node 200 may include an energy storage device health monitor 250 where the energy storage device health monitor 250 includes a set of computer-executable instructions stored on the one or more memories 220 and executable by the one or more processors 202 to cause the luminaire node 200 to monitor the energy storage device 218 to determine at least one health status associated with the energy storage device 218, and send messages indicating the health status to the network manager 128, the lighting controller 132, and/or one or more user interface devices 140-140d via the process control network 115 and/or lighting network 130, as discussed in greater detail with respect to FIG. 3 below. In an embodiment, the energy storage device health monitor 250 utilizes an energy storage device self-test application 255 to initiate a self-testing routine to test the energy storage device 218 and transmit a set of results from the self-testing routine to the network manager 128, the lighting controller 132, and/or one or more user interface devices 140-140d via the process control network 115 and/or lighting network 130, as discussed in greater detail with respect to FIG. 4. In some embodiments, the energy storage device health monitor 250 and/or the energy storage device self-test application 255 are responsive to instructions received from other components of the process control network 115, lighting network 130, and/or user interface devices 140a-140d, e.g., in a manner such as described elsewhere herein.

FIG. 3 depicts a flow diagram of an example method 300 for monitoring the health of an emergency power source for a luminaire node that is a node of a wireless mesh network utilized by a process control system, in accordance with at least some of the principles and techniques disclosed within this document. A luminaire node may perform at least a portion of the method 300, for example. In an example implementation, the luminaire node is the luminaire node 110a, 110b, or 110c of FIG. 1 or the luminaire node 200 of FIG. 2, and the luminaire node 110a, 110b, 110c, 200 performs at least a portion of the method 300, e.g., by executing the instructions 250 for energy storage device health monitoring and optionally other instructions 232. For ease of discussion, and not for limitation purposes, though, this disclosure discusses the method 300 with simultaneous reference to the industrial environment 100 of FIG. 1, the luminaire nodes 110a, 110b, 110c of FIG. 1, and/or the luminaire node 200 of FIG. 2, although the method 300 may execute in environments other than the environment 100 and/or in conjunction with luminaire nodes other than the luminaire nodes 110a, 110b, 110c, 200. In some embodiments, the method 300 includes one or more alternate and/or additional actions other than those shown in FIG. 3.

At a block 302, the method 300 may include utilizing, by a luminaire node that is a node of a wireless network utilized by a process control system, mains power to (i) route process control messages utilized by the process control system via the wireless network to thereby control an industrial process, and (ii) perform lighting, illumination, and/or illumination-related activities, such as energizing illumination source(s), maintaining communications with another luminaire and/or the lighting controller of a lighting network, performing lighting-related diagnostics, collecting and sending lighting statistics, etc. That is, the luminaire may be both a node of a wireless network utilized by the process control system and a node of a lighting network, and thus may be a luminaire node. The wireless network utilized by the process control system and at least a portion of the lighting network may be the same or different wireless mesh networks. In some configurations, at least a portion of the wireless network utilized by the process control system may also be used by the lighting network. In an embodiment, the luminaire node may utilize a time-synchronized protocol (e.g., WirelessHART or other suitable time-synchronized time synchronized protocol) to communicate via both the wireless process control network and the lighting network.

For example, when mains power is available, the luminaire node 200 may utilize mains power delivered via its mains power interface 215 to serve as a node of the wireless process control network 115, including powering associated communication interface ports 212a, 212b; processing incoming and outgoing process control messages; executing process control networking instructions 228, etc., to thereby route process control messages over the process control wireless network 115 to and from recipient wireless network nodes. Additionally, when mains power is available, the luminaire node 200 may utilize mains power to power the lighting drivers 205 to energize illumination sources 208a-208n; process incoming and outgoing lighting administrative and control messages; power associated communication interface ports 212a, 212b; execute the lighting instructions 222, etc. to thereby perform a set of lighting activities, e.g., in a stand-alone mode or in conjunction with other nodes of the lighting network 130. The luminaire node 200 may be configured, by the network manager 128, with a portion of the network schedule corresponding to the luminaire node 200, for example, and the luminaire node 200 may route messages in accordance with the defined network schedule stored at the luminaire node via the process control network 115 and optionally via the lighting network 130. Referring to FIG. 1 to illustrate, the luminaire node 110*a* may route process control messages directly to/from process control nodes 118*e*-118*g*, as well as to/from other nodes of the wireless process control network 115 via links 148*a*, 148*b*, and the luminaire node 110*a* may transmit and receive lighting network 130 communications via links 150*a*, 150*b*. The luminaire node 110*c* may route process control messages directly to/from process control node 118*d*, as well as to other nodes of the wireless process control network 115 via links 148*c*, 148*d*, and the luminaire node 110*c* may transmit and receive lighting network 130 communications via links 150*c*, 150*d*, and 150*e*.

At a block 304, the method 300 may include storing, by the luminaire node 200, energy in an energy storage device (e.g., battery, capacitor, or similar) configured to, during a loss of mains power, provide power to (i) route process control messages utilized by the process control system via the wireless network to thereby control the industrial process, and (ii) perform lighting, illumination, and/or illumination-related activities, such as energizing illumination source(s), maintaining communications with another luminaire and/or the lighting controller of a lighting network, performing lighting-related diagnostics, collecting and sending lighting statistics, etc. For example, the luminaire node may utilize the energy storage device 218 for power upon detecting a partial or total loss of mains power at the mains power interface 215.

At a block 306, the method 300 may include monitoring, by the luminaire node 200, the energy storage device 218 to determine a health status associated with the energy storage device 218. For example, the luminaire node 200 may monitor the health status associated with the energy storage device 218 by monitoring the voltage associated with the energy storage device 218. As another example, the luminaire node 200 may monitor the health status associated with the energy storage device 218 by monitoring the backup time or discharge cycle associated with the energy storage device 218. Moreover, in some examples, monitoring the energy storage device 218 to determine a health status associated with the energy storage device 218 may include performing a test of the energy storage device to determine the health status of the energy storage device (e.g., as discussed in greater detail with respect to FIG. 4). The luminaire node 200 may perform such a test periodically (e.g., daily, weekly, etc.) or based on a triggering event. For instance, in some examples, the triggering event may be a scheduled period of plant downtime or maintenance. Moreover, in some examples, the triggering event may be a command from an operator or other user, e.g., originating from a network manager node 128 of the wireless process control network 115 or an end-user device, such as one of the user interface devices 140*a*-140*d*. In some examples, the method 300 may further include predicting, based on the health status associated with the energy storage device 218, an amount of time for which the energy storage device 218 is capable of providing power to the luminaire node 200 during a loss of mains power.

At a block 308, the method 300 may include transmitting, by the luminaire node 200, via the wireless process control network 115, an indication of the health status associated with the energy storage device 218. In some examples, the luminaire node 200 may transmit the indication based on the health status associated with the energy storage device 218 being below a threshold health status value (e.g., the indication may selectively be transmitted only when the health status is below the threshold health status value). Moreover, in some examples, the message may include the predicted amount of time for which the energy storage device 218 is capable of providing power to the luminaire node 200 during a loss of mains power. For instance, the method 300 may include informing or alerting the process control network 115 and/or the lighting network 130 of the health status associated with the energy storage device 218 and/or the predicted amount of time for which the energy storage device 218 is capable of providing power to the luminaire node 200 during a loss of mains power. For example, the luminaire node 200 may transmit an alert message and/or an indication of the health status associated with the energy storage device 218, and/or the predicted amount of time for which the energy storage device 218 is capable of providing power to the luminaire node 200 during a loss of mains power, to the network manager 128, the lighting controller 132, and optionally also to one or more user interface devices 140-140*d*. In some examples, the network manager 128 may adjust the routing or scheduling of the process control messages based on the health status associated with the energy storage device 218 and/or based on the predicted amount of time for which the energy storage device 218 is capable of providing power to the luminaire node 200 during a loss of mains power.

Figure 4:
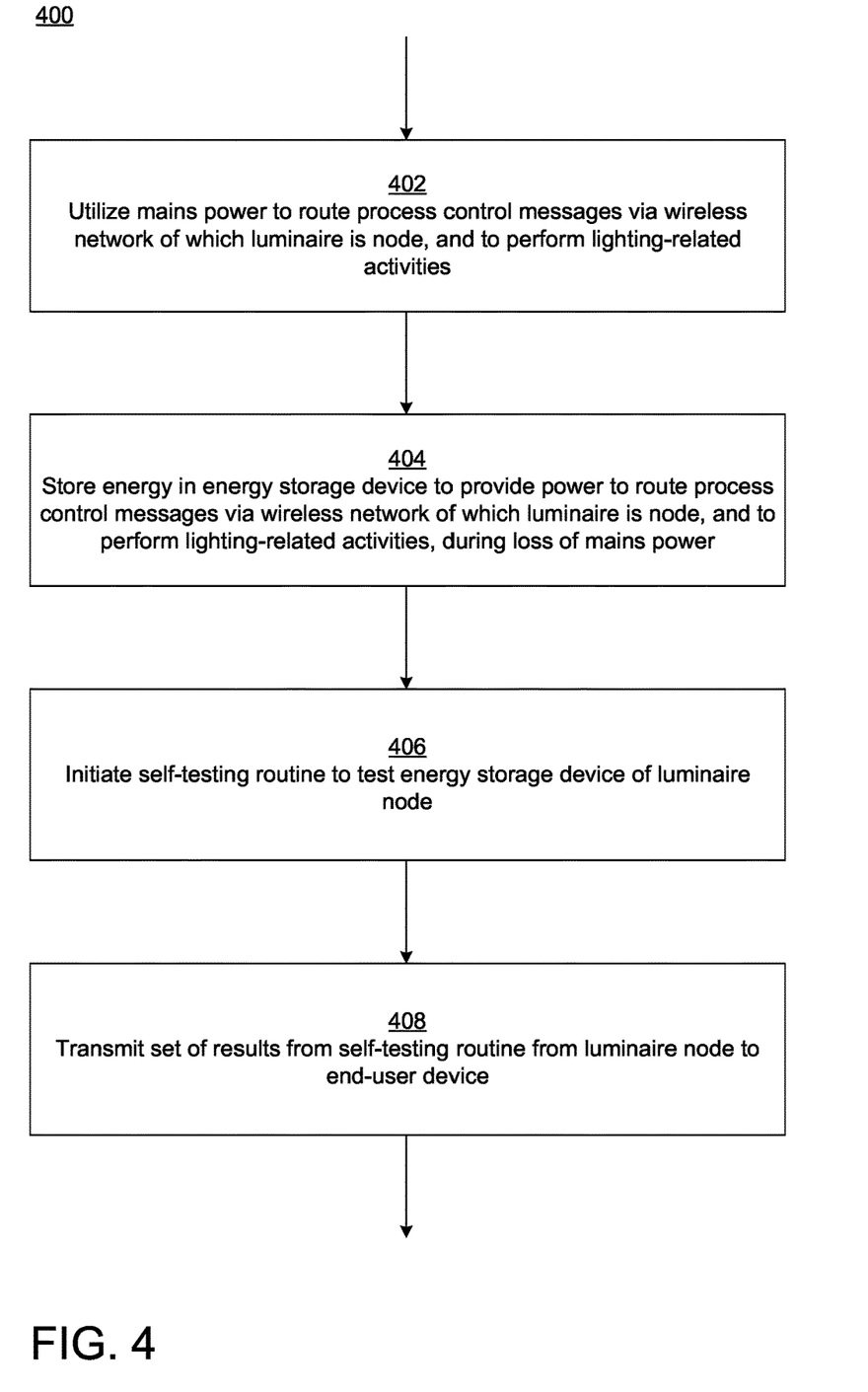
FIG. 4 is a flow diagram of an exemplary method of testing an emergency power source for a luminaire node that is a node of a wireless network utilized by a process control system.

FIG. 4 depicts a flow diagram of an example method 400 for testing an emergency power source for a luminaire node that is a node of a wireless network utilized by a process control system, in accordance with at least some of the principles and techniques disclosed within this document. A luminaire node may perform at least a portion of the method 400, for example. In an example implementation, the luminaire node is the luminaire node 110*a*, 110*b*, or 110*c* of FIG. 1 or the luminaire node 200 of FIG. 2, and the luminaire node 110*a*, 110*b*, 110*c*, 200 performs at least a portion of the method 400, e.g., by executing the instructions 250 for energy storage device health monitoring and optionally other instructions 232. For ease of discussion, and not for limitation purposes, though, this disclosure discusses the method 400 with simultaneous reference to the industrial environment 100 of FIG. 1, the luminaire nodes 110*a*, 110*b*, 110*c* of FIG. 1, and/or the luminaire node 200 of FIG. 2, although the method 400 may execute in environments other than the environment 100 and/or in conjunction with luminaire nodes other than the luminaire nodes 110*a*, 110*b*, 110*c*, 200. In some embodiments, the method 400 includes one or more alternate and/or additional actions other than those shown in FIG. 4.

At a block 402, the method 400 may include utilizing, by a luminaire node that is a node of a wireless network utilized by a process control system, mains power to (i) route process control messages utilized by the process control system via the wireless network to thereby control an industrial process, and (ii) perform lighting, illumination, and/or illumination-related activities, such as energizing illumination source(s), maintaining communications with another luminaire and/or the lighting controller of a lighting network, performing lighting-related diagnostics, collecting and sending lighting statistics, etc. That is, the luminaire may be both a node of a wireless network utilized by the process control system and a node of a lighting network, and thus may be a luminaire node. The wireless network utilized by the process control system and at least a portion of the lighting network may be the same or different wireless mesh networks. In some configurations, at least a portion of the wireless network utilized by the process control system may also be used by the lighting network. In an embodiment, the luminaire node may utilize a time-synchronized protocol (e.g., WirelessHART or other suitable time-synchronized time synchronized protocol) to communicate via both the wireless process control network and the lighting network.

For example, when mains power is available, the luminaire node 200 may utilize mains power delivered via its mains power interface 215 to serve as a node of the wireless process control network 115, including powering associated communication interface ports 212*a*, 212*b*; processing incoming and outgoing process control messages; executing process control networking instructions 228, etc., to thereby route process control messages over the process control wireless network 115 to and from recipient wireless network nodes. Additionally, when mains power is available, the luminaire node 200 may utilize mains power to power the lighting drivers 205 to energize illumination sources 208*a*-208*n*; process incoming and outgoing lighting administrative and control messages; power associated communication interface ports 212*a*, 212*b*; execute the lighting instructions 222, etc. to thereby perform a set of lighting activities, e.g., in a stand-alone mode or in conjunction with other nodes of the lighting network 130. The luminaire node 200 may be configured, by the network manager 128, with a portion of the network schedule corresponding to the luminaire node 200, for example, and the luminaire node 200 may route messages in accordance with the defined network schedule stored at the luminaire node via the process control network 115 and optionally via the lighting network 130. Referring to FIG. 1 to illustrate, the luminaire node 110*a* may route process control messages directly to/from process control nodes 118*e*-118*g*, as well as to/from other nodes of the wireless process control network 115 via links 148*a*, 148*b*, and the luminaire node 110*a* may transmit and receive lighting network 130 communications via links 150*a*, 150*b*. The luminaire node 110*c* may route process control messages directly to/from process control node 118*d*, as well as to other nodes of the wireless process control network 115 via links 148*c*, 148*d*, and the luminaire node 110*c* may transmit and receive lighting network 130 communications via links 150*c*, 150*d*, and 150*e*.

At a block 404, the method 400 may include storing, by the luminaire node 200, energy in an energy storage device (e.g., battery, capacitor, or similar) configured to, during a loss of mains power, provide power to (i) route process control messages utilized by the process control system via the wireless network to thereby control the industrial process, and (ii) perform lighting, illumination, and/or illumination-related activities, such as energizing illumination source(s), maintaining communications with another luminaire and/or the lighting controller of a lighting network, performing lighting-related diagnostics, collecting and sending lighting statistics, etc. For example, the luminaire node may utilize the energy storage device 218 for power upon detecting a partial or total loss of mains power at the mains power interface 215.

At a block 406, the method 400 may include initiating, by the luminaire node 200, a self-testing routine to test the energy storage device 218. The luminaire node 200 may initiate the self-testing routine periodically (e.g., daily, weekly, etc.), during a scheduled period of plant downtime or maintenance, or based on a command from an operator or other user, e.g., originating from a network manager node 128 of the wireless process control network 115 or an end-user device, such as one of the user interface devices 140*a*-140*d*. For example, the luminaire node 200 may test the energy storage device 218 by testing the voltage and/or the impedance associated with the energy storage device 218. As another example, the luminaire node 200 may test the energy storage device 218 by testing the backup time or discharge cycle associated with the energy storage device 218. In some examples, the method 300 may further include predicting, based on a set of test results associated with the storage device 218, an amount of time for which the energy storage device 218 is capable of providing power to the luminaire node 200 during a loss of mains power.

At a block 408, the method 400 may include transmitting, by the luminaire node 200, via the wireless process control network 115, a set of test results associated with the energy storage device 218 from the self-testing routine. For example, the luminaire node 200 may transmit the set of test results associated with the energy storage device 218 to the network manager 128, the lighting controller 132, and optionally also to one or more user interface devices 140-140*d*, or to a control application associated with one or more of the network manager 128, lighting controller 132, and/or user interface devices 140-140*d*. For instance, in some examples, transmitting the set of test results may include transmitting the indication of the predicted amount of time for which the energy storage device 218 is capable of providing power to the luminaire node 200 during a loss of mains power. In some examples, the luminaire node 200 may transmit the indication based on set of test results associated with the energy storage device 218 being below a threshold value (e.g., in some examples, the set of test results may be transmitted only when the set of test results indicate a health status associated with the energy storage device 218 that is below a threshold health status value). In some examples, the network manager 128 may perform an analysis on the set of test results, and may adjust the routing or scheduling of the process control messages based on the analysis of the set of test results associated with the energy storage device 218 from the self-testing routine and/or based on the predicted amount of time for which the energy storage device 218 is capable of providing power to the luminaire node 200 during a loss of mains power.

In an embodiment, the method 300 and/or the method 400 may further include informing or alerting the process control network 115 and/or the lighting network 130 of any detected losses of mains power at the luminaire node. For example, the luminaire node 200 may transmit an alert message and/or an indication of the loss of mains power to the network manager 128, the lighting controller 132, and optionally also to one or more user interface devices 140-140*d*.

For instance, in some examples, based on a detection of a loss of mains power, the method 300 and/or the method 400 may include utilizing at least a portion of the remaining energy stored in the energy storage device of the luminaire node to maintain the routing of the process control messages via the wireless network in accordance with the network schedule. That is, in some examples, during a loss of mains power, when the power available to the luminaire node is bounded by the amount of energy stored in the energy storage device, the luminaire node may prioritize the use of the stored energy for maintaining the routing of process control messages over performing activities related to the lighting network to thereby maintain wireless process network reliability. Additionally during a loss of mains power, the method 300 and/or the method 400 may include allocating, based on the at least the portion of the remaining energy stored in the energy storage device to maintain the routing of the process control messages via the wireless network, an amount of the remaining energy (e.g., none, or a finite amount) stored in the energy storage device to perform lighting network related activities such as energizing the illumination source(s) of the luminaire node, maintaining the communications with other luminaires, the lighting controller, and/or other nodes of the lighting network, etc.

Generally speaking, using stored energy to power process control networking activities at the luminaire node may be prioritized over user stored energy to power lighting activities at the luminaire node during a loss of mains power, e.g., to thereby mitigate or eliminate the undesirable effects on the process control network 115 due to the luminaire node 200 becoming disconnected from the network 115 (even for a relatively short amount of time). For example, the hours and possibly days required for the process control network 115 to reschedule and reorganize itself due to the loss of communications with the luminaire node 200 during a loss of mains power may be eliminated. Additionally, during a loss of mains power, network traffic and network bandwidth which must be utilized to perform the reorganization of the process control network 115 (e.g., by communicating adjusted and/or new portions of the updated schedule, by routing process control messages to avoid the luminaire node 200, etc.) and undesirable effects thereof on the performance and fidelity of the process control network 115 may be eliminated. Accordingly, in an embodiment, during a loss of mains power, allocating the amount of power to perform lighting network-related activities may include allocating any or none of the remaining available power remaining in the energy storage device 218, e.g., remaining after at least some of the available power has been allocated/utilized for maintaining the routing of process control messages, for performing one or more lighting activities. For example, in some situations, such as when the available power stored in the battery/energy storage device during a loss of mains power is less than a predetermined threshold level, the available power stored in the battery/energy storage device allocated for performing lighting network related activities may be zero or none. In some situations, a finite remaining amount of stored power is allocated for performing lighting activities during a loss of mains power, but the allocated amount of power is not sufficient to allow the luminaire node to perform all of its configured lighting activities. In these situations, during a loss of mains power, the luminaire node may perform only a subset of lighting activities and/or may only perform one or more lighting activities to a lesser degree. For example, when the allocated power for lighting activities is less than is able to support an entirety of lighting activities configured at the luminaire node during a loss of mains power, the luminaire node may forgo local illumination while maintaining the routing of lighting-related messages via the lighting network, or the luminaire node may forgo general ambient lighting but still perform emergency lighting. Additionally or alternatively, during a loss of mains power, the luminaire node may dim its local illumination sources to illuminate at a lesser degree, such as 70%, 50%, and 30% of maximum illumination respectively for different remaining amounts of power allocated for lighting purposes.

In some examples, the method 300 and/or the method 400 may include determining the at least the portion of the stored energy for maintaining the routing of process control messages via the wireless network and/or the allocated amount of stored energy for performing lighting network related activities based on an apportionment configuration stored at the luminaire node, such as the apportionment configuration 245 stored in the memories 220 of the luminaire node 200. For example, the apportionment configuration 245 may indicate a priority of performing lighting network related activities (or subset thereof and/or degree thereof) with respect to the priority of maintaining the routing of process control messages. The apportionment configuration 245 may have been downloaded or otherwise provided to the luminaire node 245, for example, by the network manager 128, the PCS servers 135, the lighting controller 132, the lighting network servers 138, or a user interface device 140a-140d. The contents of the apportionment configuration 245 may be pre-determined, and may be changed or modified, e.g., via user interface devices 140a-140d.

The apportionment configuration 245 may store an indication of a respective priority of maintaining at least some of the lighting activities (in their entirety or to a lesser degree) during a loss of mains power with respect to (e.g., relative to) the priority of maintaining process control networking for various conditions at the luminaire node 200. The relative priorities may be indicated within the apportionment configuration 245 in any suitable manner, such as by weights, percentages, differences, etc. In some embodiments, the relative priorities may be indicated by an indication of an allocation of available stored energy at the luminaire node for process control activities, an indication of an allocation of available stored energy at the luminaire node for lighting activities, or an indication of both types of allocations, during a loss of mains power, which may vary for different conditions.

The different conditions may include, for example, the amount of remaining energy stored in the energy storage device 218 during a loss of mains power, priorities of various process control messages and/or lighting messages, priorities of the types of illumination provided by the luminaire node 200 (e.g., emergency lighting, ambient lighting, etc.), and the like. For example, the relative priority of maintaining at least some of the lighting activities with respect to the priority of maintaining process control networking during a loss of mains power may vary for different levels of remaining, available power stored in the energy storage device. Thus, as the energy stored in the battery or energy storage device is drained over time, the relative priorities may also change over time (e.g., as different levels of remaining energy are reached), thereby affecting the amounts of power utilized for maintaining process control networking and the amounts of power allocated for the luminaire node to perform lighting activities. As such, detecting these and/or other trigger conditions may change the relative priorities of maintaining process control network connectivity and performing lighting related activities. Such trigger conditions may include, for example, detecting a restoration of mains power, detecting that the remaining power of the battery/energy storage device 218 has decreased to various threshold levels, detecting a loss of communicative connectivity between the luminaire node 200 and another node of the wireless process control network 115, obtaining a user instruction or override, receiving an instruction or override from the PCS servers 135 and/or the lighting servers 138, receiving an update to the network schedule from the network manager 128 and/or the lighting controller 132, etc. Accordingly, upon detecting an occurrence of a trigger conditions, the method 300 and/or the method 400 may include modifying the amount of remaining stored energy to maintain the routing of the process control messages and/or the amount of remaining stored energy allocated to the at least one of the energizing of the illumination source or the maintaining of the communications with the another luminaire.

In some examples, upon the luminaire node detecting 305 the loss of mains power and/or upon detecting another trigger condition, the method 300 and/or the method 400 may include notifying the network manager 128, the lighting controller 132, and/or one or more user interface devices 140a-140d of the occurrence of the mains power loss and/or of the trigger condition. For example, the luminaire node 200 may notify the network manager 128, the lighting controller 132 and/or the one or more user interface devices 140a-140d of occurrences of every type of detected trigger condition, of occurrences only some types of trigger conditions, of trigger conditions occurring only during some operating states of the luminaire node 200, and/or of occurrences of conditions which are not indicated in a stored apportionment configuration 245 at the luminaire node 200 or when the luminaire node 200 does not include a stored apportionment configuration 245.

In some embodiments, the method 300 and/or the method 400 may include notifying the network manager 128, the lighting controller 132, the PCS back-end servers 145, the lighting network servers 138, and/or the one or more user interface devices 140a-140d of an amount of remaining power stored in the energy storage device 218 of the luminaire node 200 (e.g., in units of power, in units of time, a remaining lifetime of the energy storage device 218, etc.), e.g., upon the detection of the loss of mains power, upon the occurrence of a trigger condition, upon the remaining stored energy dropping to a threshold level, or at any other time. In these embodiments, based on the received notification(s), the network manager 128, the PCS back-end servers 145, the lighting network servers 138, the lighting controller 132, or the one or more user interface devices 140a-140d may cause an update to the network schedule to be provided to the luminaire node 200, where the updated schedule is at least partially based on the notification. Additionally or alternatively, based on the notification, the network manager 128, the PCS back-end servers 145, the lighting network servers 138, the lighting controller 132, or the one or more user interface devices 140a-140d may cause an instruction or command to be provided to the luminaire node 200 to adjust its relative priorities between process control networking support and lighting activity support, and/or to modify the amount of available power utilized for process control networking support and/or the amount of available power allocated for lighting activity support. Such an instruction or command may override any stored allocation configuration 245 at the luminaire node 200, or may be provided in an absence of a stored allocation configuration (e.g., for the detected trigger condition or for the luminaire node as a whole) at the luminaire node 200.

The recipient of the notification of the occurrence of the triggering condition and/or of the remaining amount of locally-stored power available to the luminaire 200 and the sender of the corresponding instruction or command may be the same or different entities of the process control network 115 and/or of the lighting network 130. For example, a locally disposed user device 140c may receive the notification of the occurrence of a trigger condition (and/or a remaining level of available stored power) from the luminaire node 200, inform the lighting network server 138, and the lighting network server 138 may instruct the luminaire node 200 to adjust its respective priorities. In another example, the network manager 128 and/or the lighting controller 132 may receive the notification of a remaining level of available, locally-stored power from the luminaire node 200, inform the user interface device 140b, and the user interface device 140b may transmit an override in relative priorities to the luminaire node 200, e.g., based on a user input provided by an operator who is monitoring the status of the network(s) 115, 130.

The following additional considerations apply to the foregoing discussion.

A user interface device, personal electronic device, or portable computing device, such as the devices 140b, 140c, 140d, which may operate in conjunction with embodiments of the luminaire node disclosed herein, e.g., luminaire 110a, 110b, 110c, 200, can be any suitable device capable of wireless communications such as a smartphone, a tablet computer, a laptop computer, a wearable or body-borne device, a drone, a camera, a media-streaming dongle or another personal media device, a wireless hotspot, a femtocell, or a broadband router. Further, the portable computing device and/or embodiments of the disclosed luminaire can operate as an internet-of-things (IoT) device or an Industrial internet-of-things (IIoT) device.

Certain embodiments are described in this disclosure as including logic or a number of components or modules. Modules may be software modules (e.g., code stored on non-transitory machine-readable medium) or hardware modules. A hardware module is a tangible, non-transitory unit capable of performing certain operations and may be configured or arranged in a certain manner. A hardware module can include dedicated circuitry or logic that is permanently configured (e.g., as a special-purpose processor, such as a field programmable gate array (FPGA) or an application-specific integrated circuit (ASIC)) to perform certain operations. A hardware module may also include programmable logic or circuitry (e.g., as encompassed within a general-purpose processor or other programmable processor) that is temporarily configured by software to perform certain operations. The decision to implement a hardware module in dedicated and permanently configured circuitry, or in temporarily configured circuitry (e.g., configured by software) may be driven by cost and time considerations.

When implemented in software, the techniques can be provided as part of the operating system, a library used by multiple applications, a particular software application, etc. The software can be executed by one or more general-purpose processors or one or more special-purpose processors.

Upon reading this disclosure, those of skill in the art will appreciate still additional alternative structural and functional designs for the luminaire node e.g., luminaire 110a, 110b, 110c, 200, through the principles disclosed in this disclosure. Thus, while this document illustrates and describes particular embodiments and applications, the disclosed embodiments are not limited to the precise construction and components disclosed. Various modifications, changes and variations, which will be apparent to those of ordinary skill in the art, may be made in the disclosed arrangement, operation and details of the method, and apparatus without departing from the spirit and scope defined in the appended claims.

The patent claims at the end of this patent application are not intended to be construed under 35 U.S.C. § 112(f) unless traditional means-plus-function language is expressly recited, such as "means for" or "step for" language being explicitly recited in the claim(s). The systems and methods described herein are directed to an improvement to computer functionality, and improve the functioning of conventional computers.

What is claimed is:

1. A method of monitoring the health of an emergency power source for a luminaire node that is a node of a wireless mesh network utilized by a process control system, the method comprising:
utilizing, by a luminaire node that is a node of a wireless network utilized by a process control system, mains power to (i) route process control messages utilized by the process control system via the wireless network to thereby control an industrial process, and (ii) at least one of energize an illumination source of the luminaire node or maintain communications with another luminaire;
storing, by the luminaire node, energy in an energy storage device configured to, during a loss of mains power, provide power to (i) route process control messages utilized by the process control system via the wireless network to thereby control the industrial process, and (ii) at least one of energize the illumination source of the luminaire node or maintain communications with another luminaire;
monitoring, by the luminaire node, the energy storage device to determine a health status associated with the energy storage device; and
sending, by the luminaire node, via the wireless network, an indication of the health status associated with the energy storage device.

2. The method of claim 1, wherein monitoring the energy storage device to determine the health status associated with the energy storage device includes performing a test of the energy storage device to determine the health status of the energy storage device.

3. The method of claim 2, wherein the test of the energy storage device is performed periodically.

4. The method of claim 2, wherein the test of the energy storage device is performed is based on a triggering event.

5. The method of claim 2, wherein the triggering event is the initiation of a period of plant downtime or maintenance.

6. The method of claim 2, wherein the triggering event is a command.

7. The method of claim 6, wherein the command originates from a network manager node of the wireless network.

8. The method of claim 6, wherein the command originates from an end-user device.

9. The method of claim 1, wherein one or more of the process control messages originate from, or are received by, one or more field devices.

10. The method of claim 1, further comprising:
transmitting the indication of the health status associated with the energy storage device to a network manager for the wireless network; and
adjusting, via the network manager, the routing or scheduling of the process control messages based on the health status associated with the energy storage device.

11. The method of claim 1, further comprising:
predicting, by the luminaire node, based on the health status associated with the energy storage device, an amount of time for which the energy storage device is capable of providing power to the luminaire node during a loss of mains power.

12. The method of claim 11, wherein the indication of the health status associated with the energy storage device includes an indication of the predicted amount of time.

13. The method of claim 1, wherein sending the indication of the health status associated with the energy storage device is based on the health status associated with the energy storage device being below a threshold health status value.

14. The method of claim 1, wherein monitoring the energy storage device to determine the health status associated with the energy storage device includes monitoring an impedance associated with the energy storage device.

15. The method of claim 1, wherein monitoring the energy storage device to determine an indication of the health status associated with the energy storage device includes monitoring a voltage associated with the energy storage device.

16. The method of claim 1, wherein monitoring the energy storage device to determine an indication of the health status associated with the energy storage device includes monitoring a backup time or a discharge cycle associated with the energy storage device.

17. The method of claim 1, wherein the indication of the health status associated with the energy storage device is sent to a control application.

18. A luminaire node included in a plurality of nodes which utilize mains power to transmit and receive process control messages via a wireless network to thereby control an industrial process, the luminaire node comprising:
an illumination source energized by mains power; and
an energy storage device configured to, during a loss of mains power, provide power to energize the illumination source, and to transmit and receive the process control messages via the wireless network to thereby control the industrial process,
the luminaire node configured to:
monitor the energy storage device to determine an indication of a health status associated with the energy storage device; and
send, via the wireless network, messages including the indication of the health status associated with the energy storage device.

19. A method of testing an emergency power source for a luminaire node that is a node of a wireless network utilized by a process control system, the method comprising:
utilizing, by a luminaire node that is a node of a wireless network utilized by a process control system, mains power to (i) route process control messages utilized by the process control system via the wireless network to thereby control an industrial process, and (ii) at least one of energize an illumination source of the luminaire node or maintain communications with another luminaire;
storing, by the luminaire node, energy in an energy storage device configured to, during a loss of mains power, provide power to (i) route process control messages utilized by the process control system via the wireless network to thereby control the industrial process, and (ii) at least one of energize the illumination source of the luminaire node or maintain communications with another luminaire;
initiating, by the luminaire node, a self-testing routine to test the energy storage device of the luminaire node; and
transmitting, from the luminaire node to an end-user device, a set of results from the self-testing routine.

20. The method of claim 19, further comprising initiating the self-testing routine periodically.

21. The method of claim 19, further comprising initiating the self-testing routine during a period of plant downtime or maintenance.

22. The method of claim 19, further comprising initiating the self-testing routine in response to a command.

23. The method of claim 22, wherein the command originates from a network manager node of the wireless network.

24. The method of claim 22, wherein the command originates from an end-user device.

25. The method of claim 19, wherein one or more of the process control messages originate from, or are received by, one or more field devices.

26. The method of claim 19, further comprising:
transmitting the set of results from the self-testing routine to a network manager for the wireless network;
performing, via the network manager, an analysis of the set of results; and
adjusting, via the network manager, the routing or scheduling of the process control messages based on the analysis of the set of results.

27. The method of claim 19, further comprising:
predicting, by the luminaire node, based on the set of results from the self-testing routine, an amount of time for which the energy storage device is capable of providing power to the luminaire node during a loss of mains power.

28. The method of claim 27, wherein the indication of the health status associated with the energy storage device includes an indication of the predicted amount of time.

29. The method of claim 19, wherein transmitting the set of results from the self-testing routine is based on the set of results indicating that a health status associated with the energy storage device being below a threshold health status value.

30. The method of claim 19, wherein the self-testing routine includes testing an impedance associated with the energy storage device.

31. The method of claim 19, wherein the self-testing routine includes testing a voltage associated with the energy storage device.

* * * * *